United States Patent [19]

Chen et al.

[11] Patent Number: 4,658,229
[45] Date of Patent: Apr. 14, 1987

[54] MAGNET SYSTEM PROVIDING A REGION OF SUBSTANTIALLY HOMOGENEOUS FIELD STRENGTH

[75] Inventors: Wilkie Y. Chen, San Diego; Yen-Hwa L. Hsu, Solana Beach; John R. Purcell, San Diego, all of Calif.

[73] Assignee: GA Technologies Inc., San Diego, Calif.

[21] Appl. No.: 733,232

[22] Filed: May 10, 1985

[51] Int. Cl.$^4$ .............................................. H01F 7/22
[52] U.S. Cl. ..................................... 335/216; 335/299
[58] Field of Search ............... 335/216, 210, 213, 299, 335/300

[56] References Cited

U.S. PATENT DOCUMENTS

| 3,177,408 | 4/1965 | Mills et al. | 317/123 |
| 3,194,739 | 7/1965 | Kerst et al. | 176/1 |
| 3,491,318 | 1/1970 | Henning et al. | 335/213 |
| 3,736,539 | 5/1973 | File et al. | 335/216 |
| 3,801,438 | 4/1974 | Ohkawa | 176/3 |
| 4,263,096 | 4/1981 | Ohkawa et al. | 176/3 |
| 4,268,353 | 5/1981 | Powell et al. | 176/3 |
| 4,288,289 | 9/1981 | Landau | 176/3 |
| 4,349,506 | 9/1982 | Rawls et al. | 376/142 |
| 4,500,860 | 2/1985 | Vermilyea | 335/216 |
| 4,509,030 | 4/1985 | Vermilyea | 335/299 X |

Primary Examiner—George Harris
Attorney, Agent, or Firm—Fitch, Even, Tabin & Flannery

[57] ABSTRACT

A magnet system for providing a substantially homogeneous magnetic field in a region. The magnet system includes a main coil and a pair of correcting coils with the main coil generating a magnetic field in a zone including the region. The correcting coils are at first and second locations in the zone and are connected to one another so that a magnetic field generated by the main coil will induce currents in the correcting coils which oppose one another. The correcting coils are constructed so that there will be no resultant current in them when there is generated substantially the same field strength of both of the first and second locations. Thus, the generation of differing magnetic field strengths at the respective locations effects generation of a resultant current in the correcting coil causing strengthening of the magnetic field at the location having the lesser magnetic field strength and weakening of the magnetic field at the other location, making the net field relatively homogeneous.

18 Claims, 11 Drawing Figures

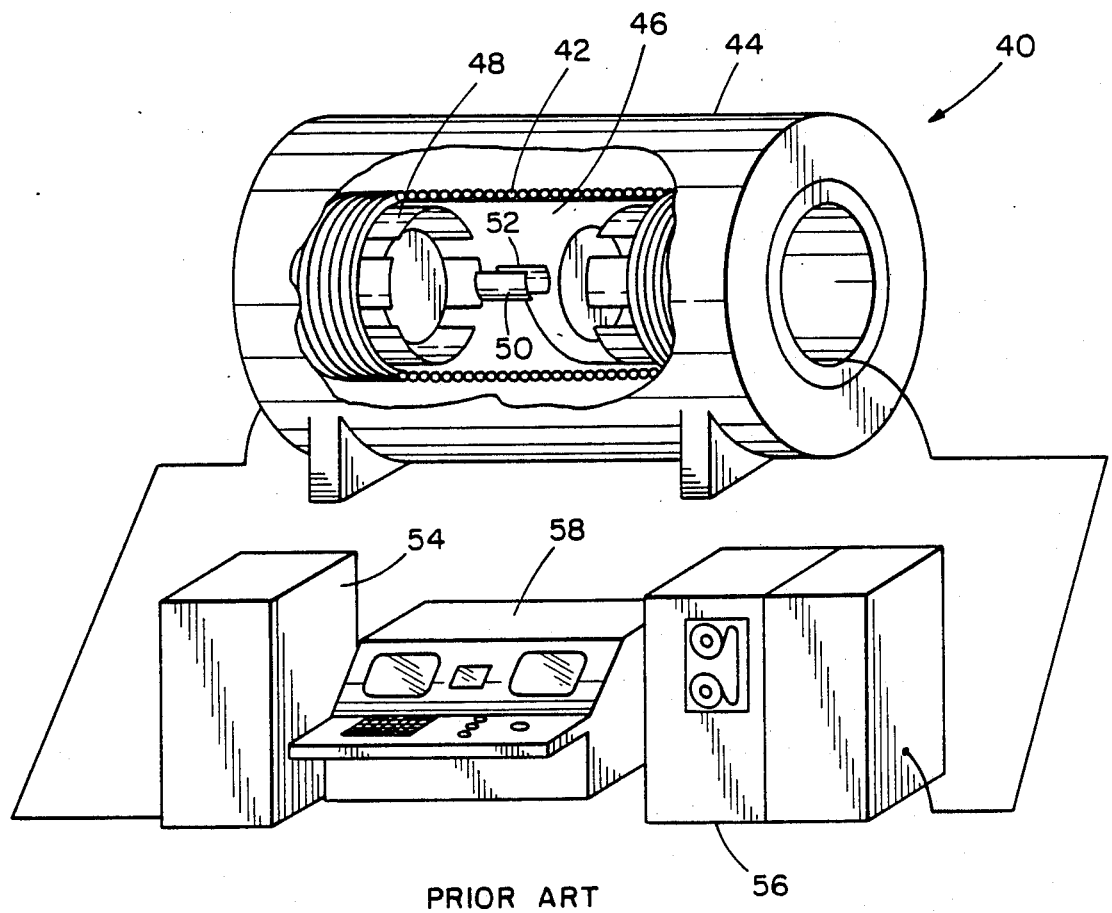
PRIOR ART
FIG.3
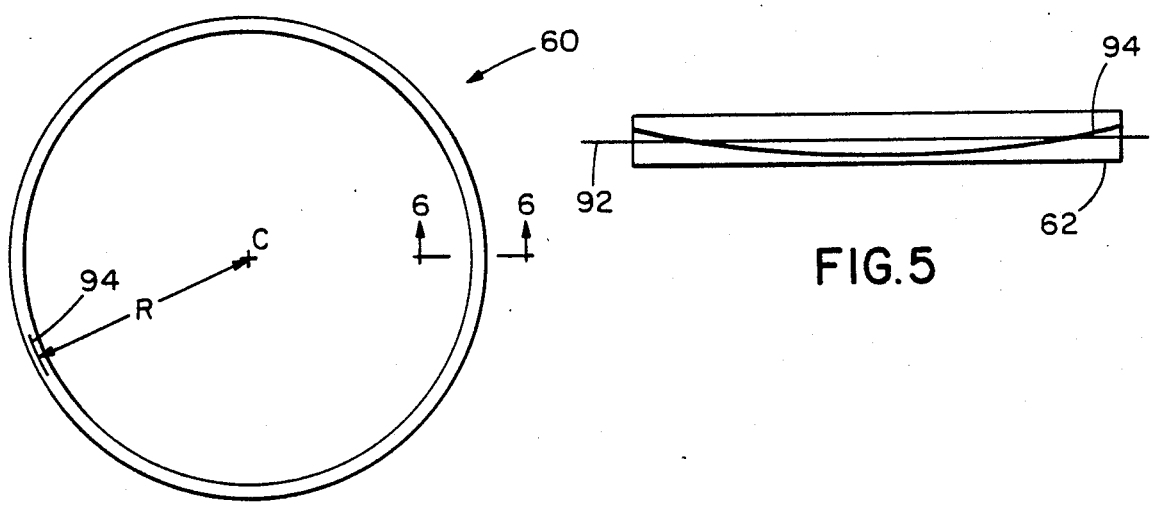
FIG.4
FIG.5

MAGNET SYSTEM PROVIDING A REGION OF SUBSTANTIALLY HOMOGENEOUS FIELD STRENGTH

BACKGROUND OF THE INVENTION

The present invention relates to apparatus for providing magnetic fields and, more particularly, to a magnet system for providing a region of substantially homogeneous magnetic field strength.

There are many areas of application for a region of substantially homogeneous magnetic field strength. An area of application is in equipment making use of the phenomenon of nuclear magnetic resonance. One such piece of equipment for medical diagnosis provides information comparable to that provided by a computerized axial tomography scanner but without subjecting the patient undergoing examination to potentially harmful X-rays.

It has been recognized that the magnetic field provided by a practical solenoid coil is not sufficiently homogeneous for such applications. In order to correct for nonuniformity in field strength, correction coil windings, connected to a source of current, have been employed at predetermined locations along the length of the solenoid. Lengthy computations as to ampere turns and extremely precise coil placement are required in order to achieve the desired field homogeneity. Slight errors in the construction of the solenoid coil obviously cannot be taken into account in the determination of the configuration and placement of the correction coils, and such slight errors could result in the region of desired homogeneity exhibiting unacceptable variations in field strength. Another problem with prior correcting coil windings is that the ambient magnetic field environment, once defined and taken into consideration in the design of the coils, cannot be altered without degradation in the field homogeneity. For example, rearrangement of furniture having ferromagnetic materials or movement of an elevator in the vicinity of the solenoid coil would degrade the desired homogeneity.

A previously proposed toroidal field-generating coil system employs two types of coils with each type of coil having sections. The number of turns and current magnitude are selected to insure the magnetic field strength at certain sections of the first type coils is approximately the same as at certain sections of the second type coils. Current is passed in opposite directions in preselected adjacent sections of different type coils so that their respective magnetic fields offset one another. For a further description of the structure and operation of such magnet system, reference may be made to U.S. Pat. No. 4,263,096.

In another prior art magnet, a superconducting solenoid is employed having a field-shaping member made of a metal having high magnetic saturation. The field-shaping member functions to prevent production of localized regions of high magnetic field strength at inner points of the superconducting winding. The field shaper interacts with the magnetic field lines in the localized region and directs the field lines to form a resultant substantially uniform strong field along the axis of the solenoid. Reference may be made to U.S. Pat. No. 3,177,408 for a further description of the structure and operation of this magnet.

SUMMARY OF THE INVENTION

Among the several aspects of the present invention may be noted the provision of an improved magnetic system for providing a substantially uniform magnetic field and requiring the application of electrical power only to the main coil, the provision of such magnet system which functions passively to self-correct deviations in magnetic field strength without using heavy iron field-shaping members, and the provision of such magnetic system which is reliable in use and is simple and economical to manufacture. The magnet system of the present invention can also compensate for alterations in the magnetic field environment so that magnetic field homogeneity is not appreciably affected. Other features and objects of the present invention will be, in part, apparent and, in part, pointed out hereinafter in the following specification and attendant claims, particularly when taken in conjunction with the accompanying drawings.

Briefly, the magnet system of the present invention includes a main coil having leads for connection to a supply of current and at least one pair of correcting coils. The main coil bounds a zone including a region desired to have a substantially homogeneous magnetic field. One of the correcting coils is disposed at a first location and the other of the coils is disposed at a second location with the coils connected to one another so that a magnetic field generated by the main coil will tend to induce currents in the correcting coils which oppose one another. The correcting coils are constructed so that when there exists a substantially homogeneous field throughout the region, there will not be a resultant current in the correcting coils. The presence of differing magnetic field strengths at the locations effects generation of a resultant current in the correcting coils which causes strengthening of the field strength at the location having the lesser magnetic field strength.

BRIEF DESCRIPTION OF THE DRAWINGS

FIG. 3 is a simplified system diagram, partially block in nature, of prior art nuclear magnetic resonance (NMR) imaging apparatus which can be modified to incorporate the magnet system of FIG. 1;

FIG. 4 is a simplified plan view of a superconducting supercollider particle accelerator which incorporates various features of the invention;

FIG. 5 is a greatly enlarged plan view of one of a multiplicity of generally straight sections which are placed in end-to-end arrangement to form the accelerator of FIG. 4, which provides a generally annular particle pass path;

DESCRIPTION OF THE PREFERRED EMBODIMENTS

Figure 1:
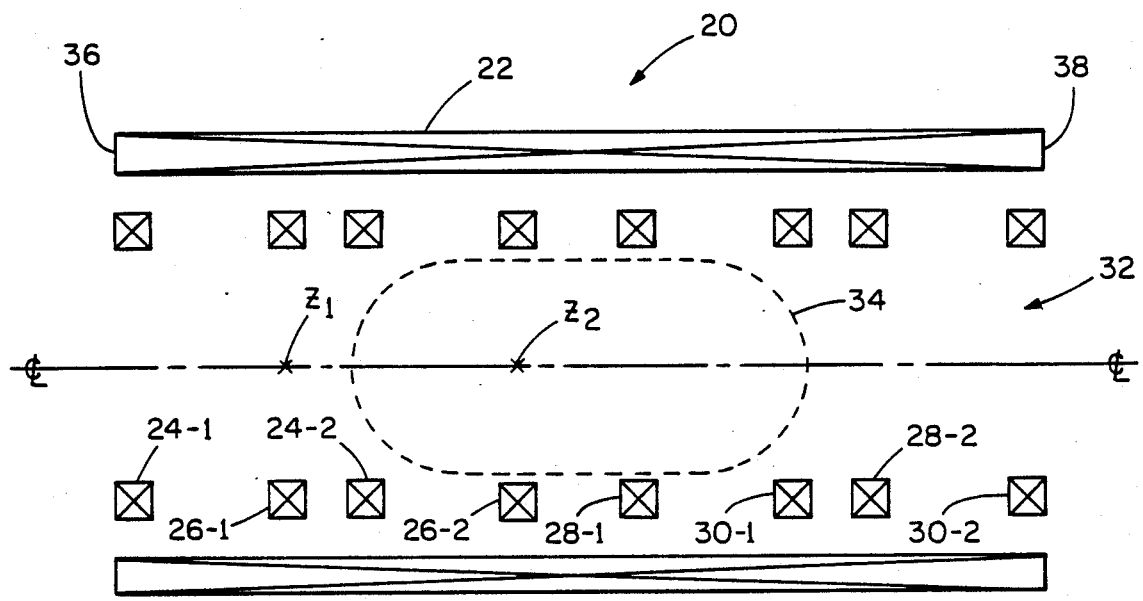
FIG. 1 is a diagrammatic axial sectional representation of one preferred embodiment of a magnet system incorporating various features of the present invention including a main solenoid and multiple pairs of magnetic field correction coils.

Referring now to the drawings, a magnet system for providing a substantially homogeneous magnetic field is generally indicated by reference numeral 20. The magnet system includes a main solenoid coil 22 and a plurality of pairs of superconducting field correcting coils 24-1, 24-2; 26-1, 26-2; 28-1, 28-2; and 30-1, 30-2 coaxial therewith. Although four pairs of correction coils are shown, it will be appreciated that the particular number of pairs is chosen merely for purposes of illustration. The number of pairs required for a particular application is a function of the length of the main coil and the desired degree of homogeneity of the field.

More specifically, the main coil 22 has leads L1, L2 for connection to a current power supply 31. The main coil bounds a zone 32 including a region 34 to be provided with a magnetic field of substantially homogeneous strength. The region 34 lies intermediate the ends 36, 38 of the coil 22 and is disposed about the axis thereof. It is not possible for the region 34 to be coextensive with the zone 32 because of the edge effect of a magnetic field generated by a coil.

The main coil 22 can be either superconducting or of conventional design. With conventional coils, the power supply for the main coil 22 must continue to provide current. On the other hand, with the use of superconducting coils, the main coil 22 need be supplied with current only until steady state conditions are achieved. Thereafter shunt means can be used to bypass the power supply, and the current will continue to flow in the main coil. The correcting coils are superconducting. In this case, the increasing magnetic field present during initial energization of the main coil induces currents in the superconducting correcting coils which continue to flow after the current level in the main coil 22 reaches a steady state.

Referring to the pair of correction coils 24-1 and 24-2; one of the coils 24-1 is at a first location in the zone 32 while the other coil 24-2 is at a second location in the zone. The coils of the pair are substantially identical, having the same number of turns and the same geometry. Coils 24-1 and 24-2 are connected to one another in such a way that a magnetic field generated by the main coil 22 will tend to induce voltages in the correcting coils which oppose one another. This can be accomplished by cross connection of coils wound in the same direction or by the conventional connection of coils which are oppositely wound. Thus correcting coils 24-1 and 24-2 are constructed and connected so that when there exists substantially the same magnetic field at both coils, there will be no resultant current generated in the pair of correcting coils. On the other hand, should there be an unbalance in the fields at the respective coils, the voltage induction is unbalanced and the greater voltage is generated in the coil located in the greater field. The currents thereby generated in the respective coils therefore act to oppose the stronger field and aid the lesser.

Referring to FIG. 1, four pairs of correcting coils are shown disposed in the zone 32 in a particular arrangement in which the correcting coils of one pair (e.g., 24-1 and 24-2) have a correcting coil (e.g., 26-1) of another pair of coils in between. More specifically, there are an even number of pairs of coils divided into sets (the pairs 24 and 26, and the pairs 28 and 30) with the first coil of the second pair (e.g., 26-1) between the coils (24-1 and 24-2) of the first pair of the set, and the second coil of the first pair (24-2) of the set between the coils (26-1 and 26-2) of the second pair of the set. It will be appreciated that this specific arrangement is only for illustrative purposes, the number of pairs of correcting coils and their relative placement being dictated by the requirements of the particular application.

Operation of the magnet system 20 of the present invention is as follows: Assuming the main coil is conventional, energization of the main coil 22 leads L1 and L2 by the power supply 31 establishes a magnetic flux which increases or decreases in intensity as a function of the current flow through the main coil. With reference to a particular coil pair, e.g., 26-1 and 26-2, the changing magnetic flux at the location of coil 26-1 induces current flow in the coil of magnitude proportional to the change of the flux linking the coil at that location. Concurrently, the changing magnetic flux coil induces a current in the coil 26-2 of magnitude proportional to the change of the magnetic flux linking the coil 26-2. Since coils 26-1 and 26-2 are connected in series, either cross-connected or wound in opposite directions, the voltages induced in these coils oppose one another and, at least partially, cancel each other. More specifically, because the two coils 26-1 and 26-2 have equal inductance (L), the induced voltage difference causes the same current i to flow in the two bucking coils. This produces a final current i and flux iL, which cancels out the field differences.

Assuming for the sake of explanation that coils 26-1 and 26-2 are each formed by a single loop and referring to FIG. 1, the field $B(z)$ on the axis of the two bucking loops located at $z_1$ and $z_2$, respectively, and immersed in a field $B_o(z)$ provided by the solenoid coil 22, is in accordance with the field equation:

$$B(z) = B_o(z) + \frac{\mu_o \Delta i}{2a}\left[\left(\frac{a^2}{a^2 + (z-z_1)^2}\right)^{3/2} - \left(\frac{a^2}{a^2 + (z-z_2)^2}\right)^{3/2}\right] \quad (1)$$

where
$a$ = the loop radius
$\mu_o$ = permeability of air
$\Delta i$ = net current in each loop.

For example, if $z_1=0$, $z_2=z=a=1$ meter, $B_o(0)=1$ tesla, and $[B_o(0)-B_o(z_2)]/B_o(0)=1\%$; then $\Delta i=12.3$ kA which is easily carried by superconductors well known to those of skill in the art.

Three conditions are possible:

(1) The rates of change of fluxes linking coils 26-1 and 26-2 are identical.
(2) There is a greater rate of change of magnetic flux through coil 26-1 than through coil 26-2.
(3) There is a greater rate of change of magnetic flux through coil 26-2 than through coil 26-1.

In the first condition, equal but opposite voltages will be induced in coils 26-1 and 26-2. These voltages completely cancel each other so that there will be no resultant current. In the second situation, the magnitude of voltage induced in the coil 26-1 is more than sufficient to cancel out the voltage induced in the coil 26-2 so that there will be a resultant current circulating in the coil pair. This resultant current will be induced due to the presence of the stronger magnetic field being created at the location of the coil 26-1. The current in the coil 26-1 generates a magnetic field opposed to the applied field, reducing the net field at that point. The resultant current flowing through the 26-2 coil generates a magnetic field component which reinforces or strengthens the field at the location of coil 26-2. The net result is that the field is reduced at the stronger field location and that the field is augmented at the location of the weaker field strength. Thus the degree of homogeneity of the field in region 34 is increased. Precisely the opposite occurs under the third possibility: a portion of the stronger field at the location of coil 26-2 is effectively transferred to the location of coil 26-1 thereby strengthening the weaker field.

Similar averaging of the respective field strengths at the location of each of the members of the other coil pairs also occurs. This results in the desired high degree of field strength homogeneity throughout region 34.

Because the correcting coils are superconducting, the current induced during energization continues to flow. As the degree of field strength nonuniformity during energization is determinative of the field strength configuration after steady state conditions are achieved, the corrections in the localized field strengths established during energization will continue to aid in field strength homogeneity after state current flow conditions are reached.

It will be appreciated that the magnet system of the present invention is passive and self-correcting. Lengthy computation in the design of correcting coils is not required nor is their precise placement critical. Furthermore, the magnet system 20 functions to correct deviations in localized magnetic field strengths due to errors in solenoid construction or changes in ambient magnetic field homogeneity. Additionally, power need only be supplied to main coil 22.

Referring now to FIG. 3, prior art NMR imaging apparatus 40 includes a superconducting magnet assembly having a main field winding 42 disposed within a vacuum cylinder 44 which also houses a cryogenic system. The cylinder 44 defines a bore 46, which is at room temperature, and within which is supported gradient coils 48 that generate the relatively weak, rapidly changing magnetic field gradients normal to the main field generated by winding 42 needed for imaging. Placed at an inner location in the bore 46 is a radio frequency antenna formed by curved panels 50 and 52. Shown interconnected with the superconducting magnet assembly are power supplies 54, data acquisition and processing equipment 56 and a display and control panel 58. For further information regarding NMR imaging and the apparatus for use in carrying out the imaging, reference may be made to the following:

(A) "Nuclear Magnetic Resonance: WIP" by Crooks et al., *Radiology*, Vol. 143, pp. 169-174, April 1982.
(B) "Principles of NMR Imaging" by Pykett, et al., *Radiology*, Vol. 143, pp. 157-168, April 1982.
(C) "NMR Imaging in Medicine" by Ian L. Pykett, *Scientific American*, May 1982.

Although not shown in FIG. 3, prior art NMR imaging apparatus typically includes sets of correction coils wound adjacent the main winding. Such coils require energization through connection to the power supplies 54, and each coil or type of coil is for a specific purpose and requires rigorous design. For example, there are axial correction coils, radial correction coils and correction coils designed for a specific order of defect along a specific axis. For further information regarding such prior art correcting coils and the great deal of mathematical calculations required for their design, reference may be made to "NMR Spectrometry in the High Fields" by Sauzade and Kan, *Advances in Electronics and Electron Physics*, Vol. 34, pp. 26-55, 1973.

The magnet system 20 of the present invention can be used to modify the prior art NMR imaging apparatus 40 of FIG. 3 by using system 20 to replace the main field winding 42. The modified imaging apparatus will offer high magnetic field homogeneity without the need for the difficult to design and less effective prior art correction coils which require connection to the power supply.

Figure 2:
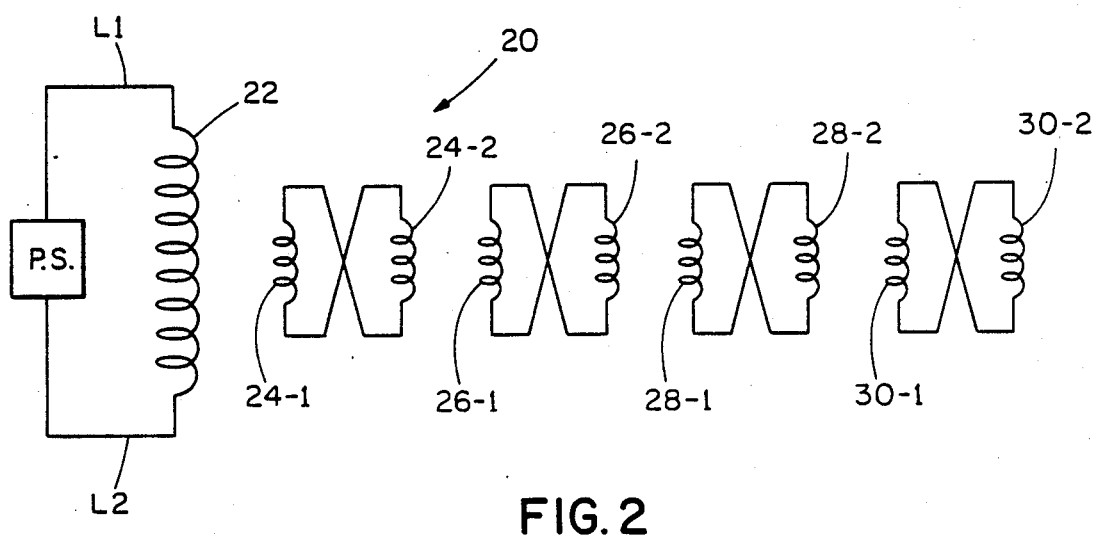
FIG. 2 is a schematic diagram showing an equivalent circuit of the magnet system of FIG. 1.
Figure 6:
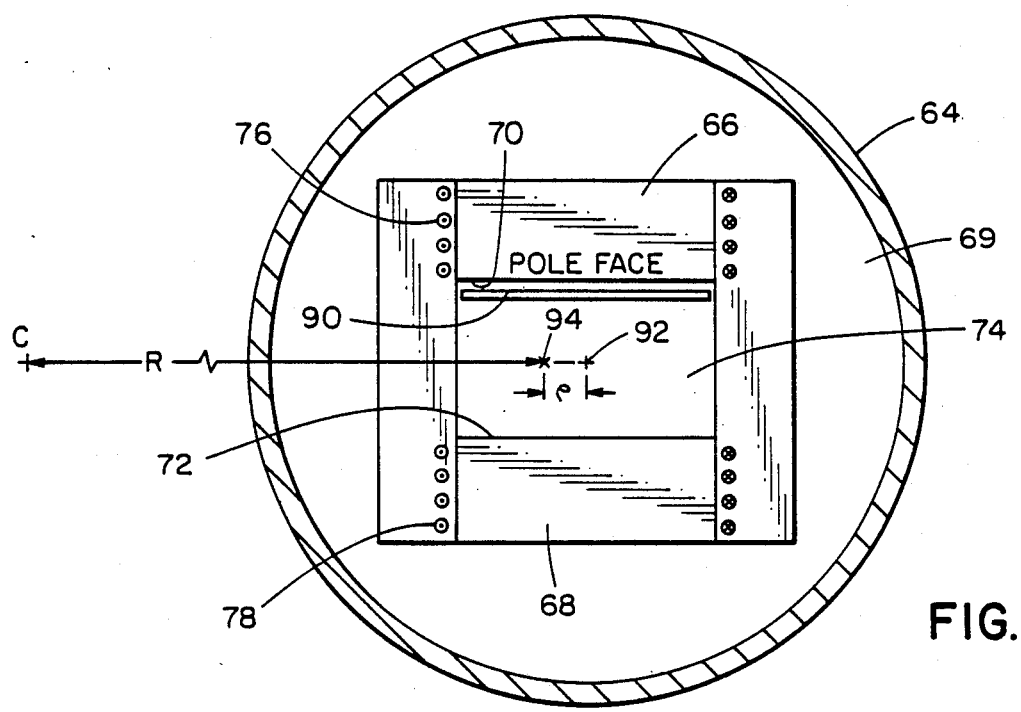
FIG. 6 is an even more greatly enlarged transverse cross-sectional view taken generally along line 6—6 of FIG. 4 depicting a pair of magnet poles, the respective adjacent faces of which partially bound the particle pass path, and with a pair of correcting coils, in a substantially planar arrangement, between the pole faces.

The present invention has application for homogenizing a magnetic field in all directions. As shown in FIGS. 1 and 2, the homogenizing was axial, in the direction of the lines of flux. In FIGS. 4-11 is shown an embodiment for transverse homogenizing. More particularly, FIGS. 4-11 show an alternative embodiment of the magnet system of the present invention usable in a superconducting supercollider particle accelerator 60, FIG. 4, which is intended to cause beams of particles, such as beams of protons and antiprotons, to collide head-on. The supercollider, which approximates an annular configuration, is formed by a great plurality of straight sections 62 (shown in FIG. 5) placed in an end-to-end arrangement. Referring to FIG. 6, each segment has an outer jacket 64 of ferromagnetic material encompassing a pair of spaced pole pieces 66, 68 having respective pole faces 70, 72 partially bounding a particle pass path 74 upon which a vacuum is drawn. The pole pieces are joined up by a ferromagnetic yoke 69. For proper operation of the supercollider, the magnetic field strength along the pole faces must be substantially homogeneous. It is pointed out that due to the great size of the supercollider and the fact that certain dimensions of components of the machine differ by orders of magnitude, in the interest of clarity and ease of explanation and understanding, FIGS. 4-11 are not drawn to scale and are greatly exaggerated in many respects. For example, the supercollider could have a diameter of 50 kilometers, each section 62 could be 75 meters long, the spacing between the pole faces could be 10 centimeters and the width of each pole face could be about 20 centimeters.

Figure 7:
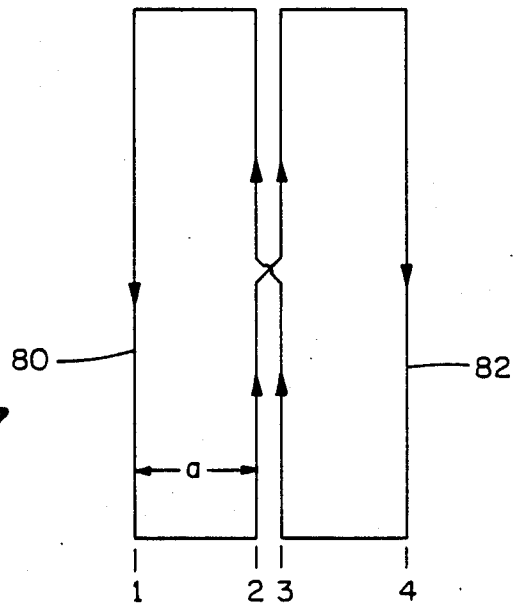
FIG. 7 is a diagrammatic representation showing the pair of correcting coils of FIG. 6, each formed by a single loop, in the general form of a figure 8.

Each pole piece preferably has a main winding 76, 78, respectively, and disposed between the pole faces is a pair of correcting coils 80, 82 which functions to provide increased homogeneity of magnetic flux density across the pole face 70. The pair of correcting coils are generally planar and form a figure 8 as shown in FIG. 7, with each coil formed by a single loop 80, 82, respectively, cross connected in bucking relationship. The term "figure 8" is to be accorded a broad meaning including a pair of loops which are substantially coplanar without regard to the spacing between the loops. It will be appreciated the pair of correcting coils formed by loops 80 and 82 represents a topological variation on the correcting coils 26-1 and 26-2 discussed above with the coils relatively displaced transversely rather than axially.

Figure 11:
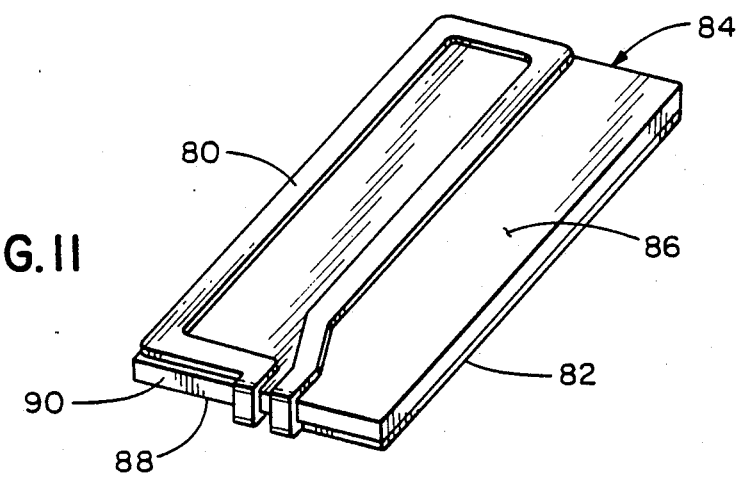
FIG. 11 is an isometric representation of a generally planar support substrate having opposite sides with one loop of a figure 8 correcting coil arrangement positioned on a respective opposite side of the substrate.

Referring to FIG. 11, the loops 80 and 82 can be mounted on a generally planar, rectangular supporting substrate 84 having opposite sides 86 and 88 and with an end 90. One loop 80 is preferably positioned on one side 86 while the other loop 82 is disposed on the other side 88. As shown in FIG. 6, the supporting substrate 84 is positioned so that it extends along the particle path 74.

Figure 8:
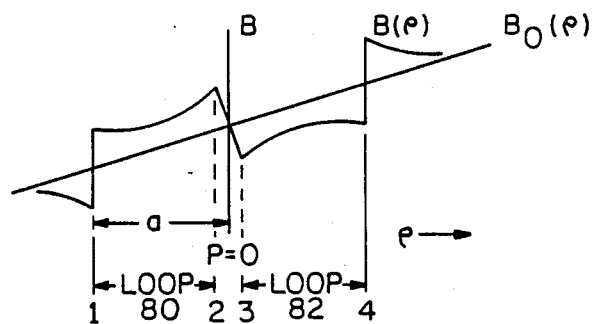
FIG. 8 is a graph showing representations of magnetic flux density versus position across the pole faces with respect to the center of the supercollider illustrating increased flux density homogeneity due to the presence of correcting coils of FIG. 7.

The figure 8 formed by the loops 80 and 82 has a height much less than its width, and may be considered planar lying in a plane parallel to the plane of the path 74. In the example it has a width of about 20 centimeters and a length approaching 75 meters. Thin plates or foil of an appropriate superconductive alloy attached to the surfaces of the substrate 84 could be etched, as in conventioned printed circuit board manufacture, to leave the desired loops 80 and 82 on the substrate. The loops are kept below their critical temperature by liquid helium supplied in a known manner over the entire accelerator 69.

Because the substantially annular supercollider is formed by a plurality of straight sections 62, the centerline of the ring-shaped particle path 74 does not exactly coincide with the centerline 92 of the straight sections. Referring to FIG. 5, the centerline of the the straight section is indicated by line 92 while the centerline of the annular particle path 74, greatly exaggerated for ease of explanation and understanding, is represented by curve 94. The transverse spacing between curve 94 and line 92 will be referred to as $\rho$, and it could be positive, negative or zero depending at what location along the straight section 62 the deviation is to be determined.

Referring to FIGS. 7 and 8, the width a of loops 80 and 82 could be about 10 centimeters, about half of the width of the figure 8. For such long figure 8's (about 75 meters) positioned between long pole faces (about 20 centimeters wide and 75 meters long), the strength of the magnetic field B($\rho$) transversely along the pole face 70 varies with the transverse deviation $\rho$ and the loop width a, as follows:

$$B(\rho) = B_o(\rho) + \frac{\mu_o \Delta i}{2\pi} + \left( \frac{1}{\rho + a} - \frac{2}{\rho} + \frac{1}{\rho + a} \right) ; \quad (2)$$

Because the metallic conductors forming loops 80 and 82, while substantially planar, do have a finite lateral thickness, the current density must be integrated over the conductor. The graph of FIG. 8 depicts the relationship for a finite thickness case. The line labeled $B_o(\rho)$ represents the deviation in magnetic field intensity along the face 70 of the pole 66 without the use of the figure 8 formed by loops 80 and 82. The main reason the $B_o(\rho)$ line is not horizontal is that the long pole face 70 is straight, and thus deviates from the desired arc of a circle configuration needed to form a truly annular pass path for the supercollider 60. The curve labeled B($\rho$) represents the improved homogeneity in magnetic field intensity along the pole face 70 resulting from the use of the figure 8 of FIG. 7. Similar to the effect of the previously-described coils 26-1 and 26-2, the figure 8 arrangement of loops 80 and 82 functions to redistribute magnetic field strengths transversely at locations having differing magnetic field strengths. That is, the current following through loops 80 and 82 causes the field strength at the location of loop 80 (which had been weaker than that at the location of loop 82) to be increased. The resultant magnetic field strength at the location of loop 82 has been decreased compared to the field strength without the presence of the figure 8. Accordingly, the degree of homogeneity of magnetic field strength across the pole face 70 has been increased due to the presence of the figure 8. While a figure 8 arrangement of correcting coils has been provided for only the pole face 70, another figure 8 arrangement could be placed adjacent the pole face 72.

Figure 9:
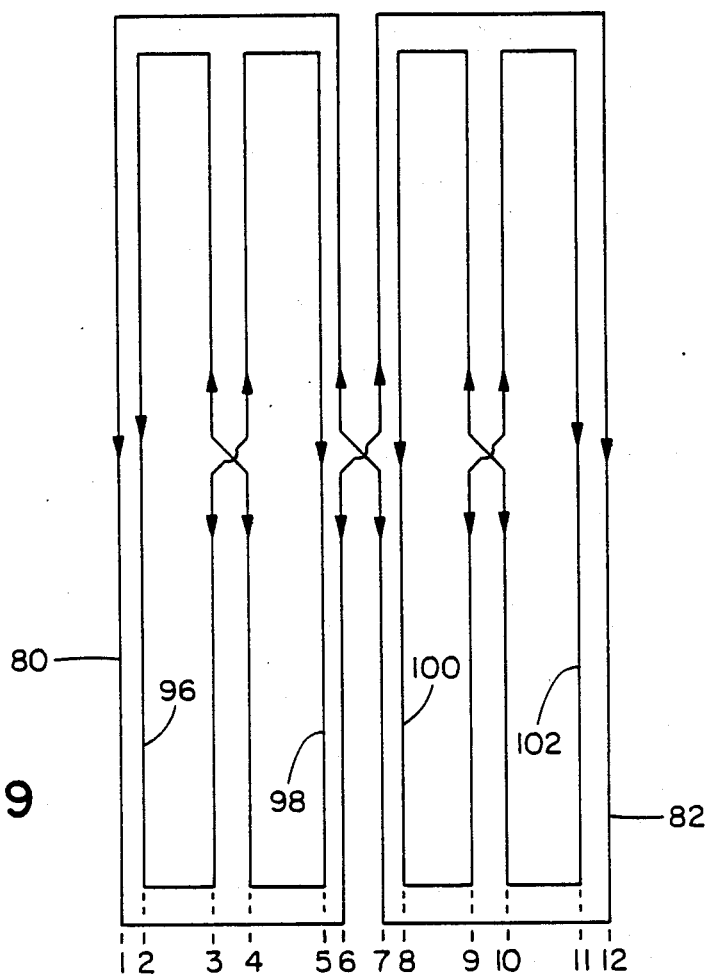
FIG. 9 is an alternative embodiment of the correcting coils of the present invention for use in the supercollider of FIG. 4, including a trio of pairs of correcting coils in planar figure 8 arrangement including a larger figure 8 and two smaller ones with each of the smaller positioned inside a respective loop of the larger figure 8.
Figure 10:
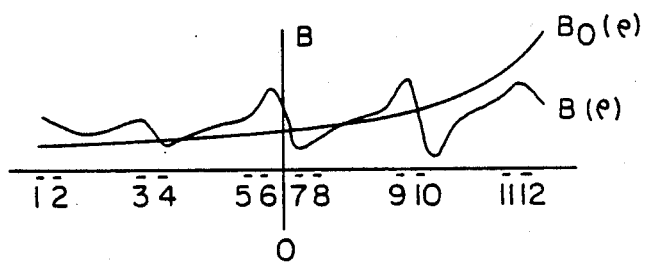
FIG. 10 is a diagram, similar to FIG. 8, showing increased flux density homogeneity due to the use of the correcting coils of FIG. 9.

Still greater field homogeneity can be realized through the use of additional pairs of bucking correcting coils. Referring to FIGS. 9 and 10, a second pair of planar figure 8 loops 96 and 98 is located inside loop 80. Additionally, a third pair of planar figure 8 loops 100 and 102 is disposed inside of loop 82. The graph of FIG. 10, similar to that of FIG. 8, depicts the increased magnetic field homogeneity across the pole face 70 resulting from the use of the triple figure 8 arrangement of correcting coils illustrated in FIG. 9.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A magnet system for providing a substantially homogeneous magnetic field in a limited region, said magnet system comprising:

means including a main coil for generating a magnetic field in a zone including said region; and at least one pair of correcting coils, one of said coils being at a first predetermined location in said zone and the other of said coils being at a second predetermined location in said zone, said coils being connected to one another so that a magnetic field generated by said means for generating induces currents in said correcting coils of said pair which oppose one another, said correcting coils being constructed so that when substantially the same field strength is generated at both of said locations, there will be no resultant current generated in a said pair of correcting coils, whereby the generation of differing magnetic field strengths at said locations effects generation of a resultant current in said correcting coils which strengthens the field at the respective location having the lesser field strength and reduces the field at the location having the greater field strength to substantially equalize the field strength at the two locations.

2. A magnet system as set forth in claim 1 comprising a plurality of pairs of said correcting coils disposed in said zone.

3. A magnet system as set forth in claim 2 wherein the correcting coils of one pair have therebetween a correcting coil of another pair of said coils.

4. A magnet system as set forth in claim 3 wherein there are an even number of pairs divided into sets with the first coil of the second pair of a set between the coils of the first pair of said set, and the second coil of the first pair of said set between the coils of the second pair of the set.

5. A magnet system as set forth in claim 1 wherein all the aforementioned coils are superconducting.

6. A magnet system according to any one of claims 1 to 5 wherein all said coils are circular and coaxial.

7. A magnet system as set forth in claim 1 wherein the coils of said at least one pair of correcting coils are substantially identical.

8. A magnet system as set forth in claim 1 wherein the coils of said at least one pair are transversely spaced.

9. A magnet system as set forth in claim 1 wherein the coils of said at least one pair are substantially coplanar.

10. A magnet system as set forth in claim 1 wherein said means for generating further comprises a pair of spaced pole pieces each having a pole face with the faces partially bounding a particle pass path, and wherein said at least one pair of correcting coils is in the general form of a figure 8 with each of said correcting coils forming one loop of the figure 8.

11. A magnet system as set forth in claim 10 wherein the loops of said figure 8 are generally coplanar with the plane in which they generally reside extending transversely of said field.

12. A magnet system as set forth in claim 10 wherein said figure 8 is a first figure 8 and wherein said magnet system comprises a second pair of correcting coils in the general form of a second figure 8 and further comprises a third pair of correcting coils in the general form of a third figure 8, said second pair of correcting coils being disposed inside one loop of said first figure 8 and said third pair of correcting coils being disposed inside the other loop of said first figure 8.

13. A magnet system as set forth in claim 10 comprising a plurality of pairs of correcting coils with each pair being in the general form of a figure 8.

14. A magnetic system as set forth in claim 13 wherein the transverse displacements of the loops of respective figure 8's differ.

15. A magnet system as set forth in claim 10 wherein the height of the figure 8 is at least one order of magnitude smaller than the width of the figure 8.

16. A magnet system as set forth in claim 10 wherein each loop of said figure 8 is substantially rectangular, having substantially square corners.

17. A magnet system as set forth in claim 10 further including a generally planar supporting substrate having opposite sides, said substrate carrying said figure 8.

18. A magnet system as set forth in claim 17 with one loop being disposed on one of said opposite sides and the other loop being disposed on the other of said opposite sides.

* * * * *